(12) United States Patent
Shin

(10) Patent No.: US 6,299,228 B1
(45) Date of Patent: Oct. 9, 2001

(54) GRIPPER APPARATUS FOR ROBOTS

(75) Inventor: Yong-soo Shin, Kunpo (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/495,678

(22) Filed: Feb. 1, 2000

(30) Foreign Application Priority Data

Feb. 2, 1999 (KR) .................................................. 99-3355

(51) Int. Cl.⁷ .................................................. B25J 15/00
(52) U.S. Cl. .............................. 294/106; 294/115; 901/36
(58) Field of Search .................................... 294/106, 115, 294/67.31, 81.51, 81.61; 901/36, 38; 269/218, 237

(56) References Cited

U.S. PATENT DOCUMENTS

| | | | |
|---|---|---|---|
| 2,355,086 | * 8/1944 | Lang | ..................... 294/106 |
| 3,370,213 | * 2/1968 | Rose | ..................... 294/115 |
| 3,534,993 | * 10/1970 | Le Vesque, Sr. | ..................... 294/106 |
| 4,185,866 | 1/1980 | Wittwer . | |
| 4,368,913 | 1/1983 | Brockmann et al. . | |
| 4,456,293 | 6/1984 | Panissidi . | |
| 4,858,979 | * 8/1989 | Parma | ..................... 294/106 |
| 5,566,466 | * 10/1996 | Hearne | ..................... 294/106 |
| 5,620,406 | * 4/1997 | Bae | ..................... 294/115 |

\* cited by examiner

*Primary Examiner*—Dean J. Kramer
(74) *Attorney, Agent, or Firm*—Larson & Taylor, PLC

(57) ABSTRACT

A gripper apparatus for a transfer robot includes a pair of grippers which are disposed in parallel in a common plane, and which are rotatable so as to move toward and away from each other to grip, and release, a workpiece. A lead screw, disposed in parallel with the rotational axis of the grippers, rotates in forward and reverse directions. A first slider is coupled to lead screw for reciprocal movement along the rotational axis of the lead screw, responsive to rotation of the lead screw. A linkage arrangement disposed between the pair of grippers converts the reciprocal movement of the first slider into rotational movement of the grippers. A drive unit provides the forward and reverse rotation of the lead screw. This configuration results in a gripper apparatus which is vertically compact and thus uses space in an efficient manner.

4 Claims, 6 Drawing Sheets

GRIPPER APPARATUS FOR ROBOTS

FIELD OF THE INVENTION

The present invention relates to gripper apparatus for transfer robots and the like.

DESCRIPTION OF THE RELATED ART

Generally speaking, robots are now used as substitutes for human beings in many applications including those involving hazard working environments, repetition of simple mechanical operations, or operations requiring large amounts of power. Robots are currently used in almost all areas of human endeavor including those involving the military, astronomy, agriculture and marine exploration as well as in many industrial fields.

Industrial robots have been especially widely used in the fields of welding, fabrication, coating, inspecting, machine operations and transfer, and the like. In the case of transfer robots, i.e., robots used to transfer a workpiece from one location to another, gripper devices and apparatus have been developed which can easily pick up and transfer a workpiece based on the size, weight, and other features of the workpiece to be transferred.

The present invention can perhaps be best understood by reference to a specific example of the prior art. Referring to FIGS. 6–8, FIG. 6 is a front elevational view of a conventional gripper apparatus for a transfer robot, FIG. 7 is a longitudinal section view of the apparatus of FIG. 6 and FIG. 8 is a sectional view taken generally along line VIII—VIII of FIG. 6. As depicted therein, the conventional gripper apparatus is comprised of a housing 101 and a pair of grippers 103 for picking up a workpiece 120 to be transferred. The grippers 103 are arranged opposite to each other, and each is rotatably connected or assembled to the housing 101.

As shown in in FIG. 7, within the housing 101 is provided a gripper driver 107 for rotating the grippers 103. The gripper driver 107 includes a lead screw 109 rotatably disposed in, and extending in the vertical direction within, the housing 101, a slider member 115 which moves up and down in response to the rotation of the lead screw 109, a pair of slider links 119, and a pair of gripper links 104. One end of each slider link 119 is connected to the slider 115 while the other end thereof is connected to a respective gripper 103 through an associated gripper link 104.

At each end portion of the lead screw 109 are installed support members 113 for supporting the lead screw 109 while enabling rotation thereof. Below the lower supporting member 113, there is provided a first gear 111 which rotates together with the lead screw 109 at the lower end portion of the lead screw 109. A pair of guide rails 117 are disposed in parallel in housing 101, at locations adjacent to opposite sides of the lead screw 109. The guide rails 117 are designed to guide vertical or elevational movement of the slider 115.

At the center portion of the slider 115 is formed a female screw 116 which is coupled to the lead screw 109 so that the slider 115 moves up and down in response to forward and reverse rotation of the lead screw 109.

Each gripper 103 is formed with a gripping groove 105 for gripping a handle 122 protruding from the top of the workpiece 120 to be transferred.

Adjacent to the lead screw 109 is installed a driving motor 121 for rotating the lead screw 109 in opposite, i.e., forward and reverse, directions. A second gear 123, coupled to an output shaft (not shown) of the driving motor 121, engages the first gear 111 of the lead screw 109.

In the conventional gripper apparatus for a transfer robot illustrated, because the lead screw 109 is disposed to extend in the vertical direction inside the housing 101, the overall height of the gripper apparatus is relatively large, and thus space is inefficiently used.

SUMMARY OF THE INVENTION

Accordingly, it is an object of the present invention to provide a gripper apparatus for a transfer robot or the like which is of a relatively small height and thus is vertically compact, thereby increasing the efficiency of space utilization.

To accomplish the object, the present invention provides a gripper apparatus for a transfer robot or the like comprising a pair of grippers disposed in parallel in a common plane, the grippers being rotatable about a rotational axis so as to move toward or away from each other to provide gripping release of a workpiece; a lead screw disposed in parallel with the rotational axes of the grippers, and rotatable in forward and reverse directions; a first slider coupled to the lead screw for reciprocal movement along the rotational axis of the lead screw responsive to rotation of the lead screw; converting means, disposed between said pair of grippers, for converting the reciprocal movement of the first slider into the rotational movement of the grippers; and driving means for rotating the lead screw in said forward and reverse directions.

Preferably, the converting means includes a pair of first slider links, each having first and second ends, the first ends of each of the slider links being rotatably coupled to the first slider; guide means for guiding the second ends of the first slider link such that the second ends of said first slider links move in a direction transverse to the rotational axis of the lead screw; and a pair of gripper links each having a first end connected to the second end of a respective one of the first slider links and a second end connected to a respective one of the grippers so as to rotate coaxially therewith.

Preferably, the guide means includes a guide rail extending in the transverse direction to the rotational axis of the lead screw, and disposed adjacent to the second ends of said first slider links; and a pair of second sliders slidable on said guide rail.

Advantageously, the converting means further comprises a pair of connection links each having a first end connected to a respective one of the second end of said first slider links and a second end connected to a respective one of the gripper links.

In a preferred implementation, the converting means further comprises a pair of second slider links having a first end connected to a respective one of the second end of the first slider links and a second end connected to a respective one of the connection links.

Preferably, the driving means and the lead screw are connected together by a pulley structure.

Further features and advantages of the present invention will be set forth in, or apparent from, the detailed description of preferred embodiments thereof which follows.

PREFERRED EMBODIMENTS OF THE INVENTION

Figure 1:
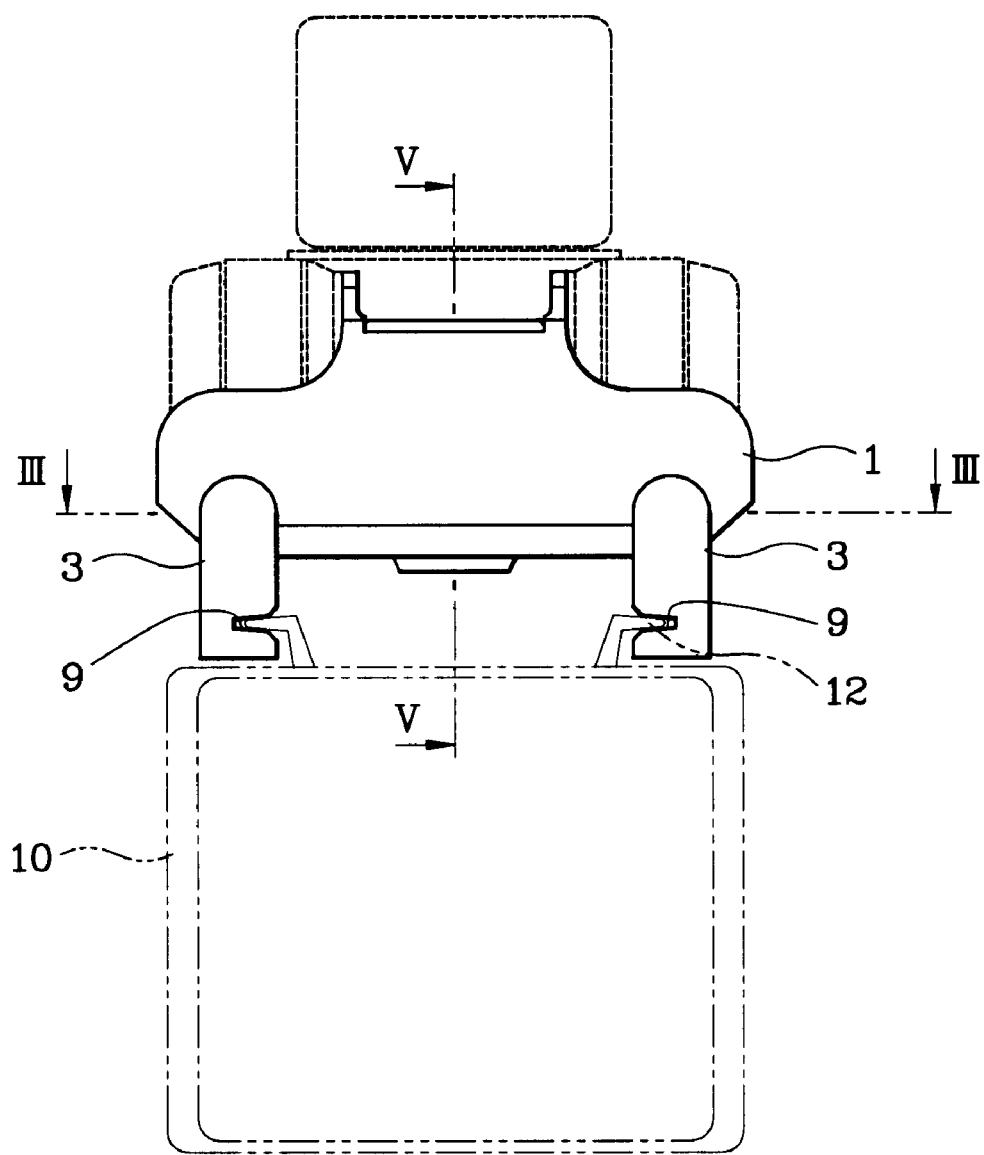
FIGS. 1 and 2 are front elevational and side elevational views, respectively, showing a gripper apparatus for a transfer robot according to a preferred embodiment of the present invention.
Figure 2:
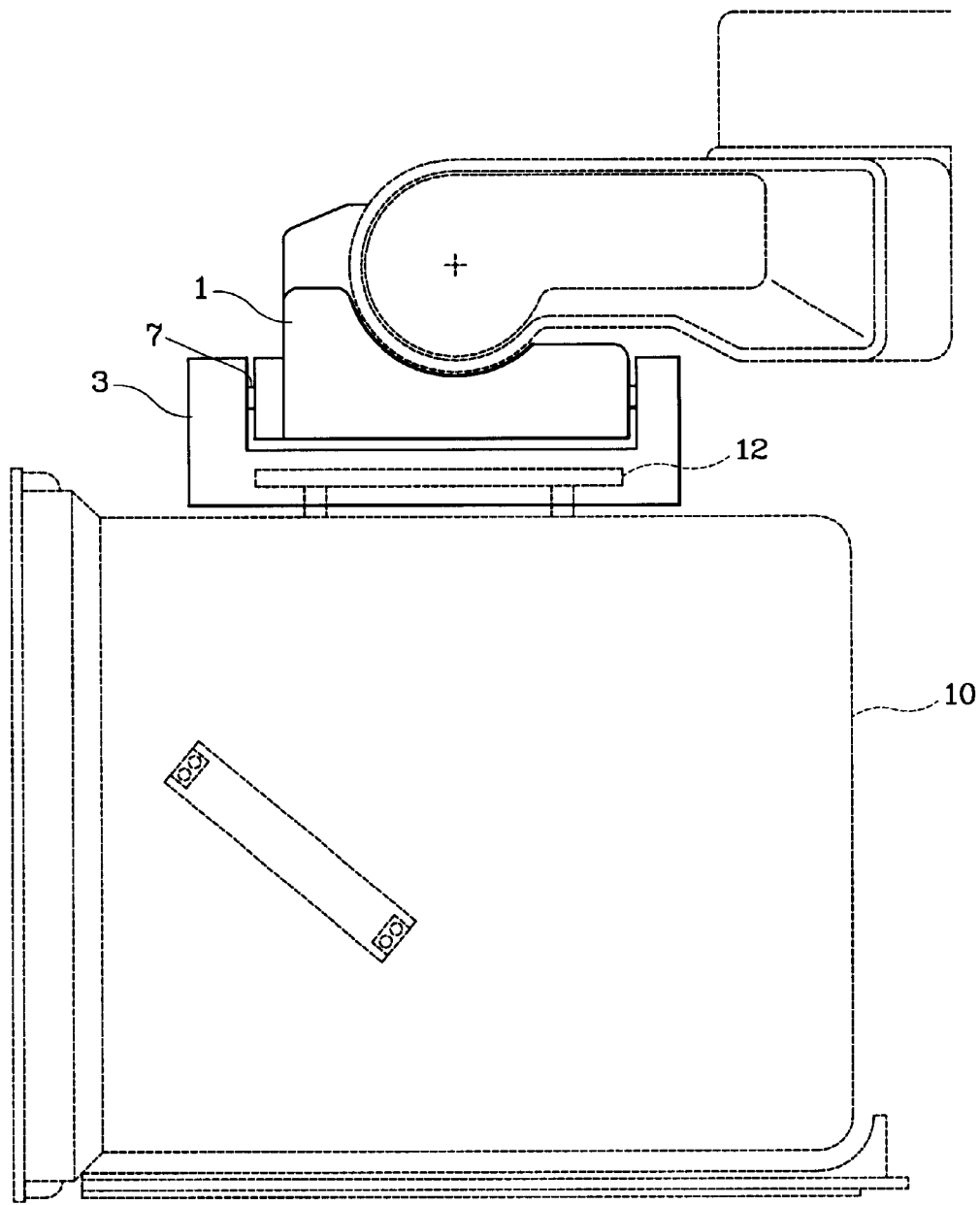
Figure 6:
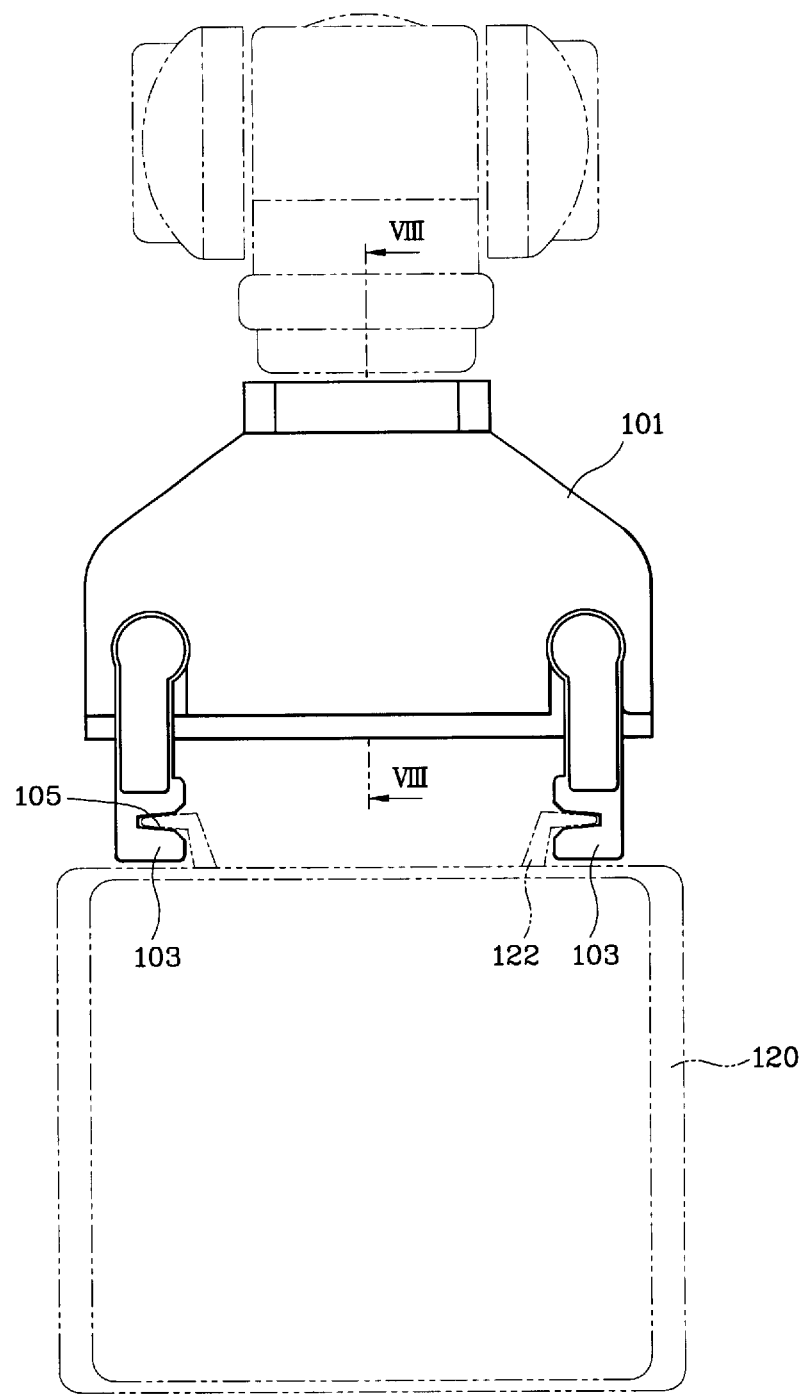
FIG. 6 is, as set forth above, a front elevational view of a conventional gripper apparatus for a transfer robot.
Figure 7:
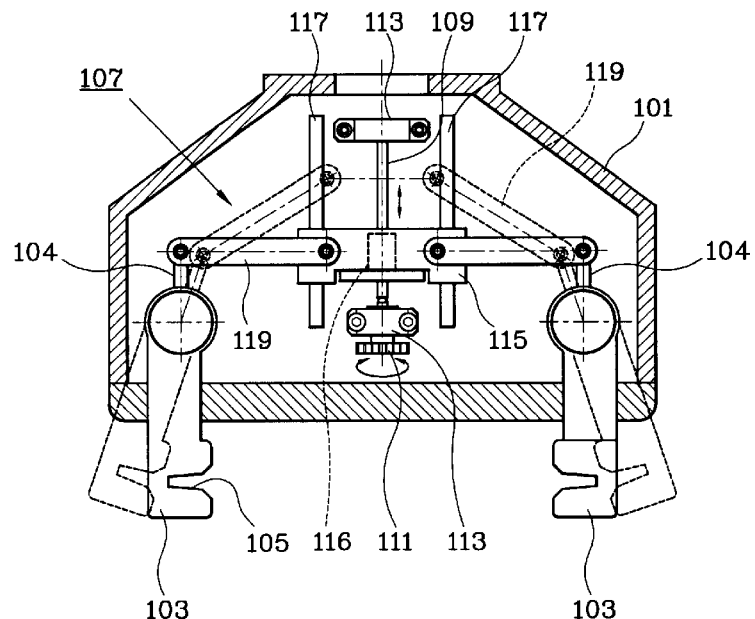
FIG. 7 is, as set forth above, a cross sectional view of the apparatus of FIG. 6.
Figure 8:
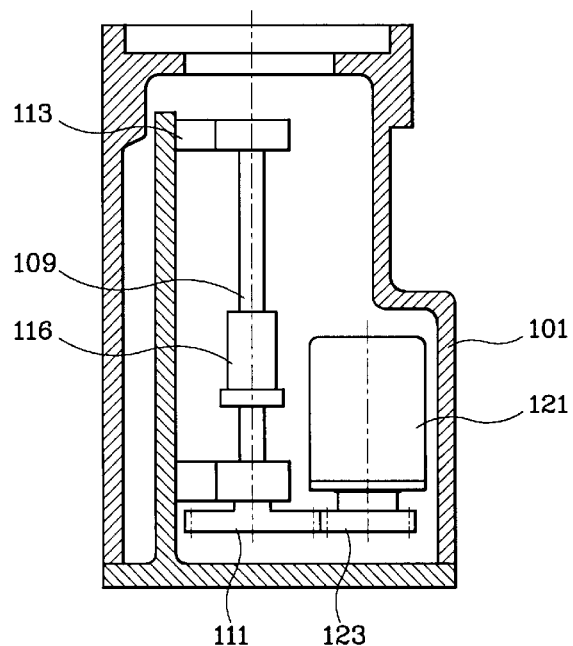
FIG. 8 is, as set forth above, a further cross sectional view taken generally along line VIII—VIII of FIG. 6.

As indicated above, FIGS. 1 and 2 are front elevational and side elevational views, respectively, showing a preferred embodiment of a gripping or gripper apparatus for a transfer robot, according to the present invention. As shown in these figures, the gripper apparatus includes a housing 1 and a pair of grippers 3 connected to the lower part of the housing 1. The housing 1, in accordance with the present invention, is lower or smaller in height than, and thus more vertically compact than, the conventional gripper apparatus described above. It is noted that FIGS. 1 and 2, as well as FIGS. 3–5, illustrate a gripper device or apparatus which is similar to that of FIGS. 6–8 and some generally corresponding elements have been given reference numerals corresponding to the last digit of the respective three place reference numerals of FIGS. 6–8 (e.g. so that the grippers are 3 in FIGS. 1–5 and 103 in FIGS. 6–8).

As shown in FIG. 2, the grippers 3 are of substantially U-shaped configuration in cross section. Each gripper 3 has a rotational shaft 7 rotatably coupled to a corresponding shaft mounting hole (not shown) formed in the housing 1. As can be best seen in FIG. 1, at the lower part of each gripper 3 is formed with a gripping groove 9 for gripping a respective handle 12 extending from the top of a workpiece 10 to be transferred.

Figure 3:
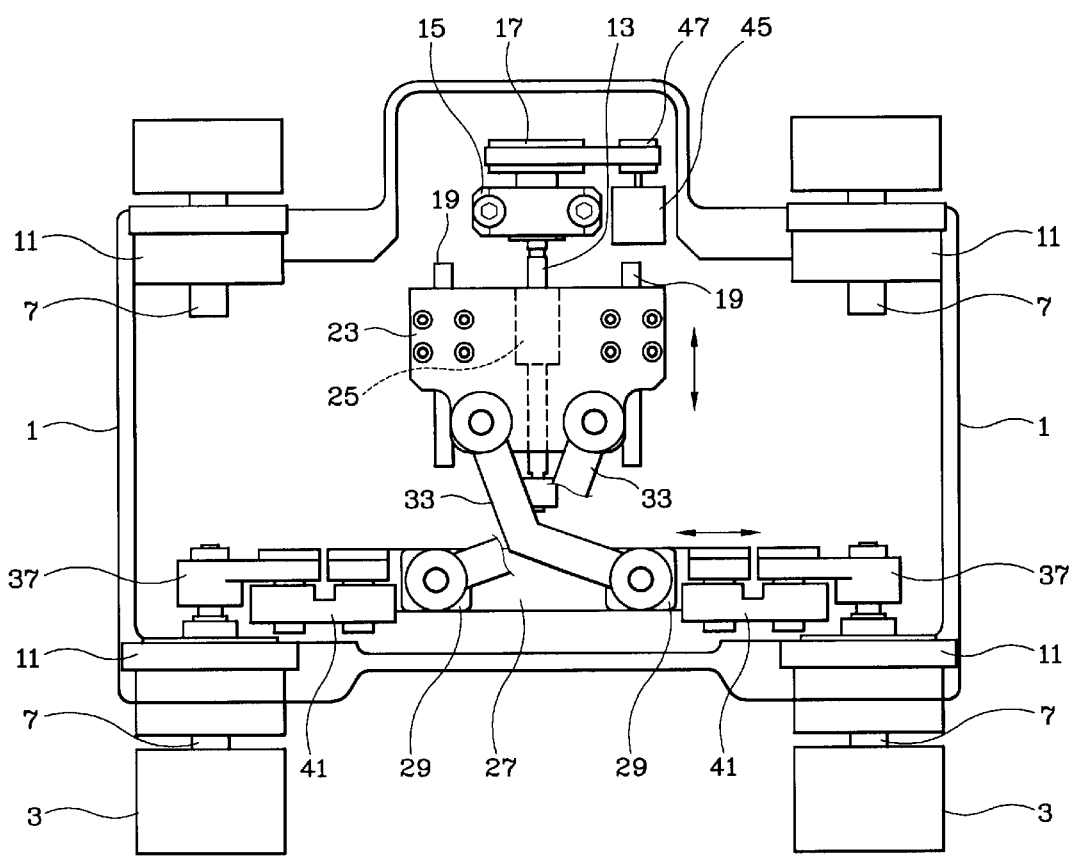
FIG. 3 is a cross sectional view, drawn to an enlarged scale, taken generally along line III—III of FIG. 1.
Figure 4:
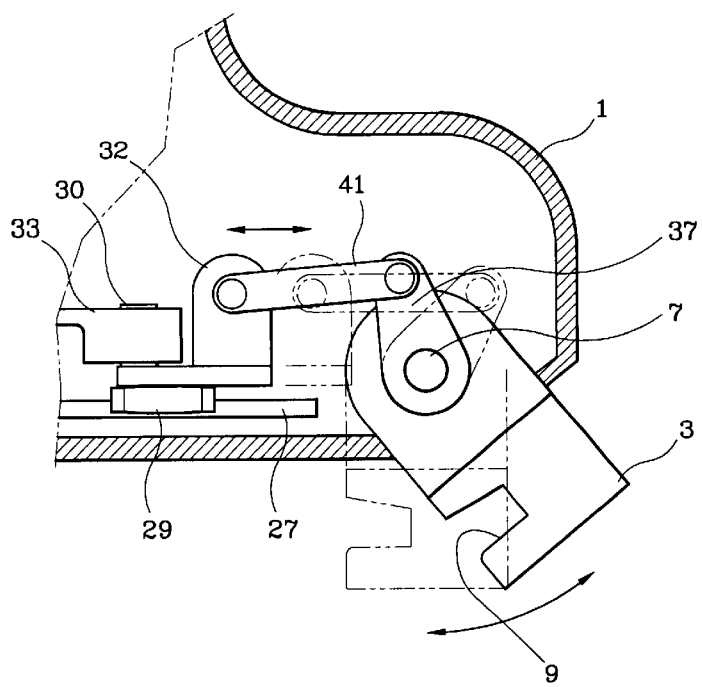
FIG. 4 is an enlarged partial cross sectional view of one of the grippers of FIG. 1.
Figure 5:
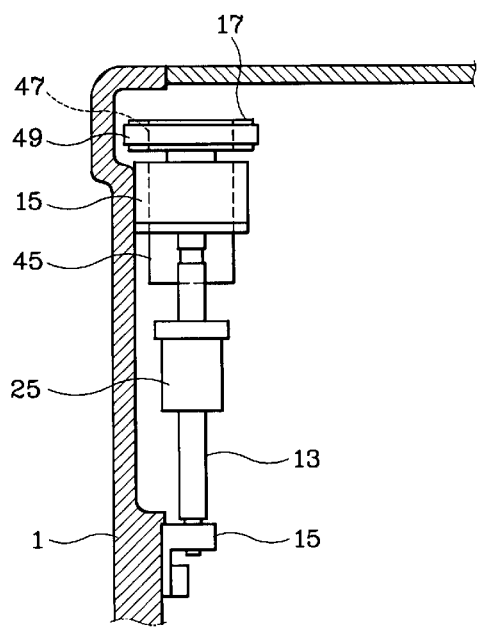
FIG. 5 is an enlarged partial cross sectional view taken generally along line V—V of FIG. 1.

As was also indicated above, FIG. 3 is an enlarged cross sectional view generally taken along line III—III of FIG. 1, FIG. 4 is an enlarged partial cross sectional view showing one gripper 3 of FIG. 1, and FIG. 5 is an enlarged partial cross sectional view taken generally along line V—V of FIG. 1. As depicted in FIGS. 3–5, the housing 1 is formed with shaft accommodation parts 11 for supporting the grippers 3. In the shaft accommodation parts 11 are formed shaft holes for rotatably receiving the respective rotational shafts 7 of the grippers 3. In the center portion of the housing 1 is disposed a lead screw 13 which extends in parallel with the rotational shafts 7 of the grippers 3.

The lead screw 13 is rotatably supported at both ends thereof by support members 15 which protrude from, or extend outwardly from, the bottom face of the housing 1. Male screw threading (not shown) is provided on the circumferential surface of the lead screw 13 and extends along lead screw 13 over a predetermined distance in the longitudinal direction. To one end of the lead screw 13 is coupled a driven pulley 17 which rotates together with the lead screw 13.

Adjacent to the lead screw 13 is installed a pair of guide rails 19 in parallel with the lead screw 13. A first slider 23 is slidably coupled to the pair of guide rails 19. In a center portion of first slider 23 is formed a female screw 25 engaging the male screw threading (not shown) of the lead screw 13, so that the first slider 23 reciprocates in a horizontal plane responsive to forward and reverse rotation of the lead screw 13.

Between the rotational shafts 7 of the grippers 3 is installed a second guide rail 27 (see FIGS. 3 and 4) which extends perpendicular to the rotational axis of the lead screw 13. Two further sliders 29 are slidably coupled to the second guide rail 27. The further sliders 29 slide along the second guide rail 27 responsive to rotation of the rotational shafts 7 of the grippers 3. As perhaps can be best seen in FIG. 4, on each of the further sliders 29 is installed a second slider link 32. One end of each second slider link 32 is connected to a rotational shaft 30. Each rotational shaft 30 of each further slider 29 is coupled to one end of a first slider link 33 which, in turn, is coupled at the other end thereof to the first slider 23. As shown in FIG. 3, the first slider links 33 have central portions which are bent and which cross with one another, similarly to a pair of scissors.

As shown in FIG. 3, gripper links 37 are coupled to the rotational shafts 7 of the grippers 3 at one end thereof so as to rotate together with the rotational shafts 7. Between the other end of each of the gripper links 37 and each of the second slider links 32 is connected a respective connection link 41.

Adjacent to the lead screw 13 is installed a driving motor 45 having an output shaft (not shown) extending in parallel with the lead screw 13. To the output shaft of the driving motor 45 is coupled a driving pulley 47 corresponding to the driven pulley 17 of the lead screw 13. The driving pulley 47 and the driven pulley 17 are connected by a belt 49.

In use, when the grippers 3 of FIGS. 1–5 are disposed over the object 10 to be transferred, the driving motor 45 is energized. Responsive to the rotation of the drive shaft of the driving motor 45, the lead screw rotates in the opposite direction to the direction of rotation of the driving motor 45. Accordingly, the first slider 23 moves in a direction away from the driven pulley 17 along the first guide rails 19.

As a consequence of this movement, the second sliders 29 slide along the second guide rail 27 by virtue of the connection thereof, provided by the first slider links 33, to the first slider 23, so that the sliders 29 move away from each other. As a result, the gripper links 37 are rotated in opposite directions to each other by virtue of the connection thereof to the sliders 29 provided by the second slider links 32 and the connection links 41. The grippers 3 are thus rotated so as to approach to each other, responsive to the rotation of the gripper links 37. Accordingly, the handles 12 of the workpiece 10 to be transferred can be accommodated in and engaged by the gripping grooves 9 of the grippers 3.

If the workpiece 10 gripped by the grippers 3 is transferred to a location for unloading by a transfer robot (not shown), the drive shaft of the driving motor 45 is caused to rotate in the opposite direction, and the grippers 3 are then rotated so as to move away from each other. As a result of this movement, the workpiece 10 is released from the grippers 3.

As described above, according to the present invention there is provided a gripper the apparatus for a transfer robot which is of a relative low height and is thus vertically compact, thereby providing more efficient use of available space.

Although the present invention has been described in connection with a preferred embodiment thereof, it will be appreciated by those skilled in the art that additions, modifications, substitutions and deletions not specifically described hereinabove can be made in this embodiment without departing from the spirit and scope of the invention.

What is claimed is:

1. A gripper apparatus for a robot, said gripper apparatus comprising:

a pair of grippers disposed in parallel in a common plane, said grippers being rotatable about a rotational axis so as to move toward and away from each other to provide gripping and release of a workpiece;

a lead screw disposed in parallel with the rotational axes of said grippers and rotatable in forward and reverse directions;

a first slider coupled to said lead screw for reciprocal movement along the rotational axis of said lead screw responsive to rotation of said lead screw;

converting means, disposed between said pair of grippers, for converting the reciprocal movement of said first slider into the rotational movement of said grippers; and driving means for rotating the lead screw in said forward and reverse directions, said converting means including:

a pair of first slider links each having first and second ends, the first end of each of said slider links being rotatably coupled to the first slider;

guide means for guiding the second end of each of said first slider links such that said second ends of said first slider links move in a direction transverse to the rotational axis of said lead screw; and a pair of gripper links, each having a first end connected to the second end of a respective one of the first slider links and a second end connected to a respective one of said grippers so as to rotate coaxially therewith;

and said guide means including:

a guide rail extending in said transverse direction to the rotational axis of said lead screw, and disposed adjacent to said second ends of said first slider links; and a pair of second sliders slidable on said guide rail.

2. A gripper apparatus according to claim 1, wherein said converting means further comprises a pair of connection links each having a first end connected to the second end of a respective one of said first slider links and a second end connected to a respective one of said gripper links.

3. A gripper apparatus according to claim 2, wherein said converting means further comprises a pair of second slider links having a first end connected to the second end of a respective one of said first slider links and a second end connected to a respective one of said connection links.

4. A gripper apparatus according to claim 1, further comprising a pulley structure connecting said driving means and said lead screw.

* * * * *